United States Patent [19]

Song

[11] Patent Number: 5,699,296
[45] Date of Patent: Dec. 16, 1997

[54] THRESHOLD VOLTAGE VERIFICATION CIRCUIT OF A NON-VOLATILE MEMORY CELL AND PROGRAM AND ERASURE VERIFICATION METHOD USING THE SAME

[75] Inventor: Bok Nam Song, Kyungki-Do, Rep. of Korea

[73] Assignee: Hyundai Electronics Industries Co., Ltd., Kyungki-Do, Rep. of Korea

[21] Appl. No.: 622,037

[22] Filed: Mar. 21, 1996

[30] Foreign Application Priority Data

Mar. 21, 1995 [KR] Rep. of Korea ................. 95-5924

[51] Int. Cl.$^6$ ............................................. G11C 11/34
[52] U.S. Cl. ...................... 365/185.22; 365/185.18; 365/185.29; 365/218
[58] Field of Search ..................... 365/185.21, 185.22, 365/185.18, 185.29, 218

[56] References Cited

U.S. PATENT DOCUMENTS

| | | | |
|---|---|---|---|
| 5,179,537 | 1/1993 | Matsumoto | 365/201 |
| 5,265,059 | 11/1993 | Wells et al. | 365/204 |
| 5,426,611 | 6/1995 | Maruyama | 365/218 |
| 5,463,586 | 10/1995 | Chao et al. | |
| 5,557,572 | 9/1996 | Sawada et al. | 365/189.07 |
| 5,572,465 | 11/1996 | Bashir | 365/185.21 |

*Primary Examiner*—David C. Nelms
*Assistant Examiner*—Hien Nguyen
*Attorney, Agent, or Firm*—Fish & Richardson, P.C.

[57] ABSTRACT

This invention relates to a threshold voltage verification circuit of a non-volatile memory cell which can automatically verify a threshold voltage of the cell according to the change of electron charge which is injected to a floating gate of the cell in program operation and erasure operation for the cell.

11 Claims, 5 Drawing Sheets

THRESHOLD VOLTAGE VERIFICATION CIRCUIT OF A NON-VOLATILE MEMORY CELL AND PROGRAM AND ERASURE VERIFICATION METHOD USING THE SAME

FIELD OF THE INVENTION

This invention relates to a non-volatile memory cell, and more particularly to a threshold voltage verification circuit of a non-volatile memory cell and a program and erasure verification method using the same which can automatically verify a threshold voltage of the cell according to the change of electron charge which is injected to a floating gate of the cell in program operation and erasure operation for the cell.

BACKGROUND OF THE INVENTION

Generally, a flash EEPROM(Electrically Erasable Programmable Read Only Memory) cell having program and erasure functions has a plurality of merits, thereby gradually increasing its demand. In case that program bias voltage (for example, 12 volts) is applied to a control gate electrode for a desired time, t1 through t2 time of FIG. 1B using a bias voltage generator 1 of FIG. 1A and a source electrode is ground while a constant voltage($V_D$) is applied to a drain electrode, electron charge is injected to a floating gate of the cell, so the cell is programmed. To verify whether or not the charge is injected to the floating gate in the predetermined amount, read bias voltage, for example, 5 volts, is applied to the control gate electrode 2 from the bias voltage generator 1 for a desired time, t2 through t3 time of FIG. 1B, then cell current(that is, cell threshold voltage) is sensed. If the sensed threshold voltage is smaller than a predetermined level, program bias voltage (12 volts) from the bias voltage generator 1 must be applied to the control gate electrode for t3 through t4 time of FIG. 1B, again threshold voltage of the cell must be verified again. That is, the threshold voltage must be verified after the program biases voltage is repeatedly applied to the control gate electrode so that electron charge is injected to the floating gate and the threshold voltage of the cell reach at a predetermined voltage level. In charging and discharging the control gate to a desired level, a lot of time is spend because the bias voltage applied to the control gate 2 is swing between a program mode and a verification mode, that is, from 12 volts to 5 volts or in inversion. Accordingly, there are problems that byte program time is increased as well as it is difficult to embody a verification circuit. Also, there is a shortcoming that over erasure is occurred for erasure mode.

SUMMARY OF THE INVENTION

Therefore, an object of this invention is to provide a threshold voltage verification circuit of a non-volatile memory cell and program and erasure verification method using the same which can solve the above problems by automatically verifying threshold voltage of the cell according to the change of electron charge which is injected to a floating gate of the cell in program and erasure operations for the cell.

To accomplish the above object, a threshold voltage verification circuit of a non-volatile memory cell having a control gate, a drain and a source according to the present invention comprises:

means for supplying a bias voltage to the control gate, the drain and the source during program mode or erasure mode; and inverting means for generating a logic signal depend on drain current of the cell, wherein input logic threshold voltage of said inverting means is equal to threshold voltage of the cell.

A program verification method of the invention, comprises the steps of:

supplying a bias voltage for program mode to a control gate, a drain and a source of a non-volatile memory cell; and sensing threshold voltage of said cell by using an inverter of which input logic threshold voltage is equal to threshold voltage of the cell.

An erasure verification method of the invention, comprises the steps of:

supplying a bias voltage for erasure mode to a control gate, a drain and a source of a non-volatile memory cell; and sensing threshold voltage of said cell by using an inverter of which input logic threshold voltage is equal to threshold voltage of the cell.

BRIEF DESCRIPTION OF THE DRAWINGS

For fuller understanding of the nature and objects of the invention, reference should be made to the following detailed description and the accompanying drawings in which.

Similar reference characters refer to similar parts in the several views of the drawings.

DETAILED DESCRIPTION OF THE INVENTION

Figure 1A:
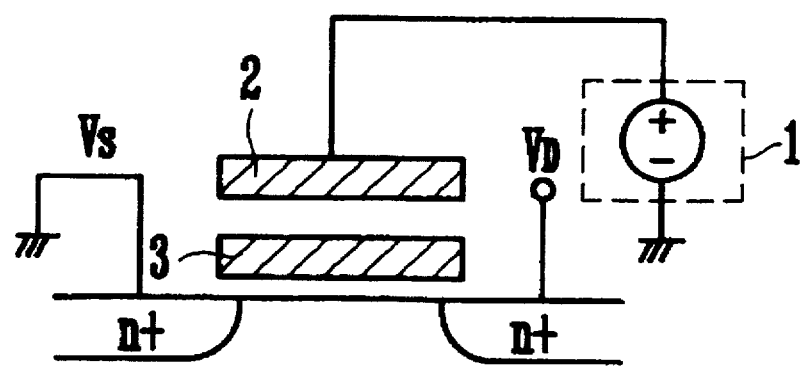
FIG. 1A is a cross-sectional view of a flash EEPROM cell.
Figure 1B:
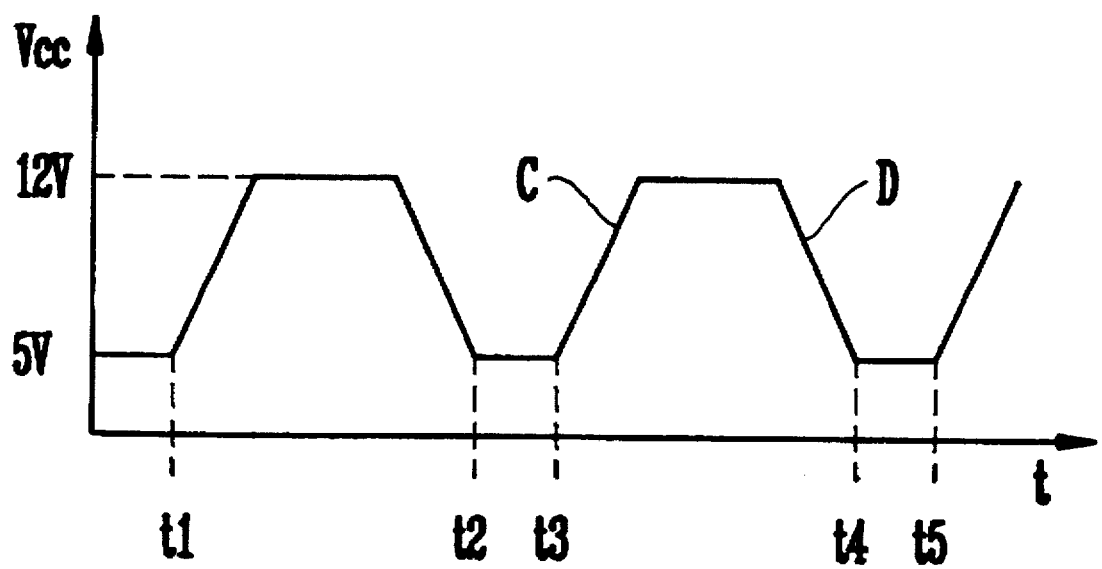
FIG. 1B is a waveform for explaining the electrical operation of FIG. 1A.
Figure 2A:
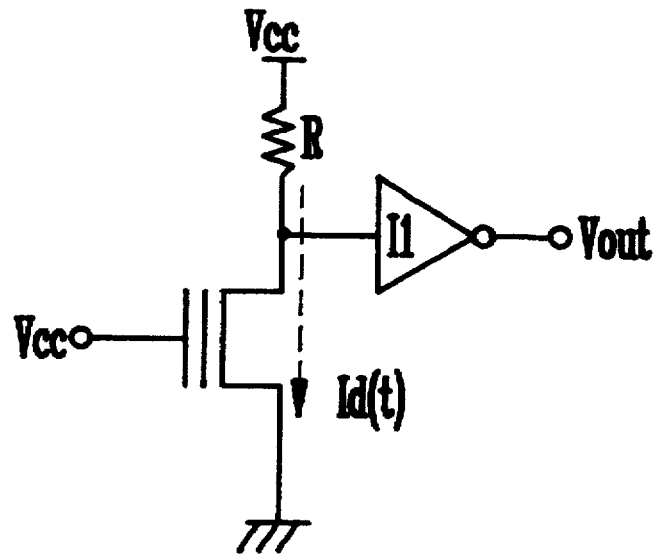
FIG. 2A and FIG. 2B are threshold voltage verification circuits of a non-volatile memory cell according to the present invention.
Figure 2B:
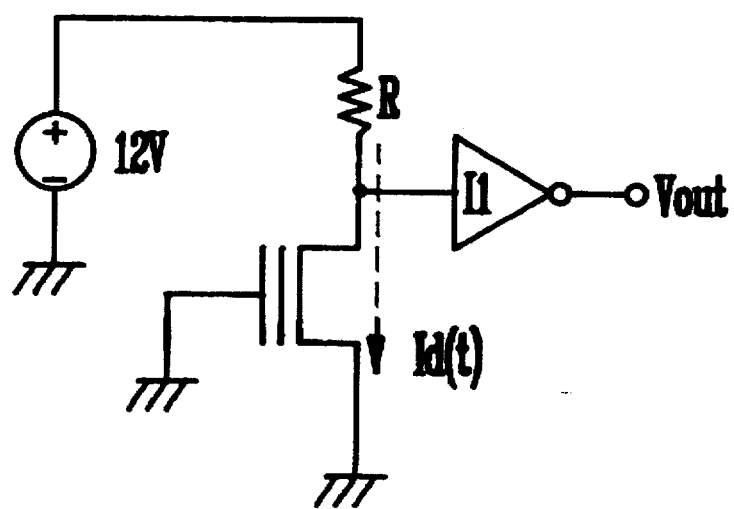
Figure 3A:
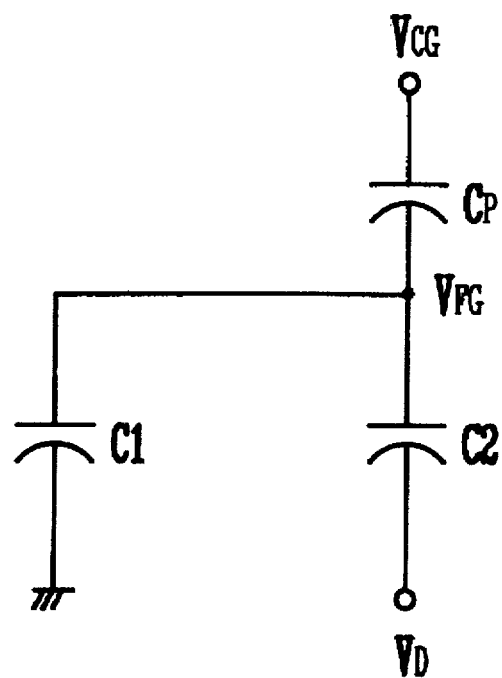
FIG. 3A and FIG. 3B are equivalent circuits of a flash EEPROM cell.
Figure 3B:
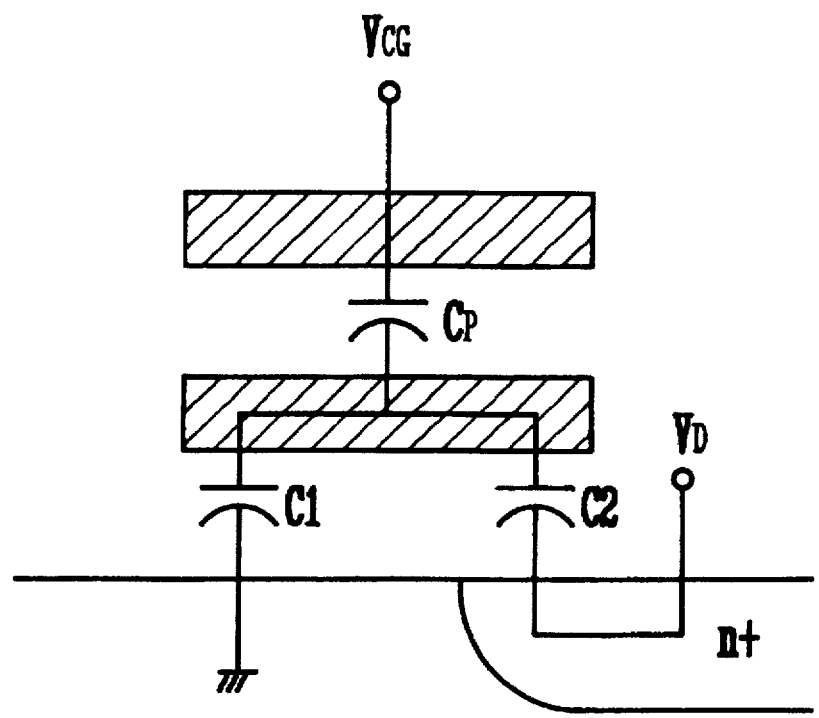

FIG. 2A and FIG. 2B are threshold voltage verification circuits of a non-volatile memory cell, which will be described with reference to FIG. 3A and FIG. 3B.

Cell current(Id) flowed through a drain electrode during program operation or erasure operation is determined by the channel inversion of a flash EEPROM cell, that is, such a cell current is actually determined by floating gate voltage (Vfg) which acts in gate. Voltage(Vfg) induced to a floating gate through a capacitor depend on control gate voltage (Vcg), which is external applied voltage, and drain voltage (Vd) will be obtained as follow:

$$Vfg = KP \times Vcg + Kd \times Vd + Qfg/Ct$$

$$Vtx = -Qfg/kp$$

where, KP; control gate to floating gate coupling ratio(about 0.5)

kd: drain to floating gate coupling ratio(about 0.25);

Qfg: stored charge in floating gate;
Ct: parallel capacitance of Cp and Cox(C1+C2);
Vtx: cell threshold voltage.

That is, the floating gate voltage will be expressed as follow equation.

$$Vfg(t)=Kp \times Vcg+Kd \times Vd-Kp \times Vtx(t) \quad (A)$$

By the above equation(A), we can know that change of cell threshold voltage (Vtx) according to change of the time is linearly proportional to the floating gate voltage(Vfg). In case that the cell threshold voltage(Vtx) is 2 volt through 5 volt, the floating gate voltage Vfg will be presumed as follows.

If Vtx=2 volt, Vfg=8 volt;
If Vtx=5 volt, Vfg=6 volt.

Hence, assuming that the cell is operated in linear region of a MOS transistor, cell current(Id) is proportional to the floating gate voltage. As a result, the cell current(Id) is reduced more than 25 percents(6V/8V) at a minimum.

Figure 4:
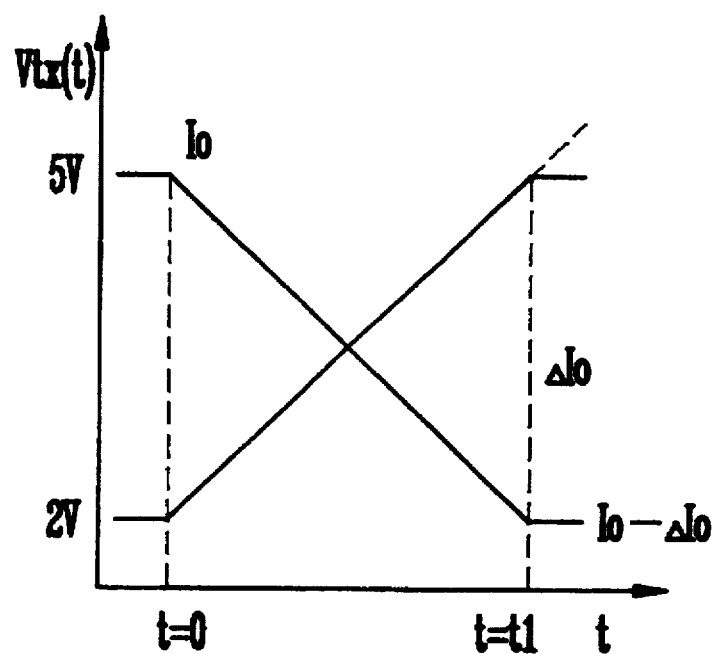
FIG. 4 is a waveform illustrating threshold voltage and drain current of the flash EEPROM cell.
Figure 5:
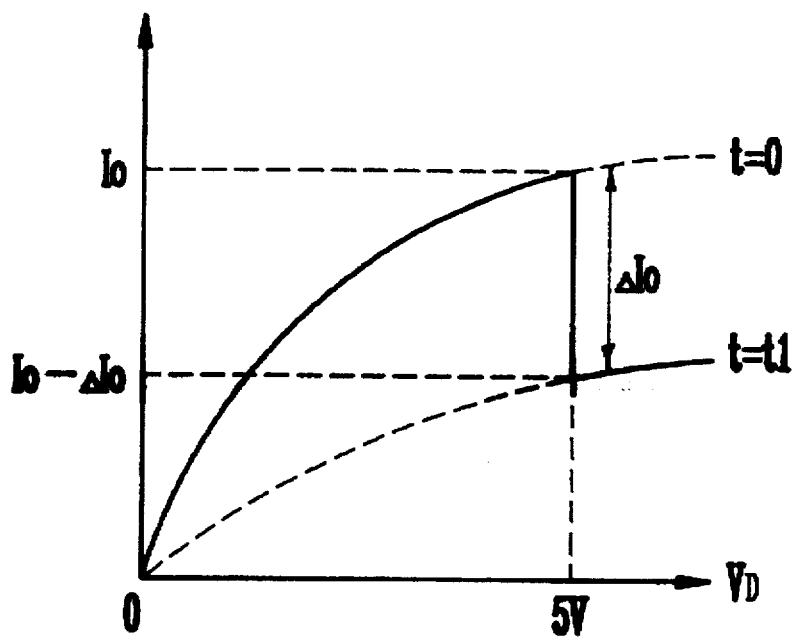
FIG. 5 is a waveform illustrating change of drain current which is changed according to floating gate voltage of a flash EEPROM cell.

FIG. 4 illustrate change of cell threshold voltage(Vtx) according to change of the time(t), and change of cell current(Id), while FIG. 5 illustrates change of cell current according to the floating gate voltage (Vfg). Assuming that the circuit to automatically verify the cell threshold voltage during program operation is constructed as FIG. 2A, cell drain voltage(Vd(t)) is as follow:

$$Vd(t)=Vcc-R \times Id(t) \quad (B)$$

Where,
Vcc: supply voltage;
R: resistor;
Id(t): drain current of the cell.

Hence, assuming that the cell current(Id) is reduced as much as $\Delta$Io from initial current(Io) due to programming for t=t1 time, drain voltage(Vd(t)) is obtained as follow.

$$Vd(t)=Vcc-R(Io-\Delta Io) \quad (C)$$

Accordingly, if input threshold voltage level of an inverter I1 of FIG. 2A will be qual to the equation(C), an output of the inverter I1 is inverted at that time. As a result, the cell threshold voltage can be automatically sensed simultaneously with programming of the cell.

Figure 6:
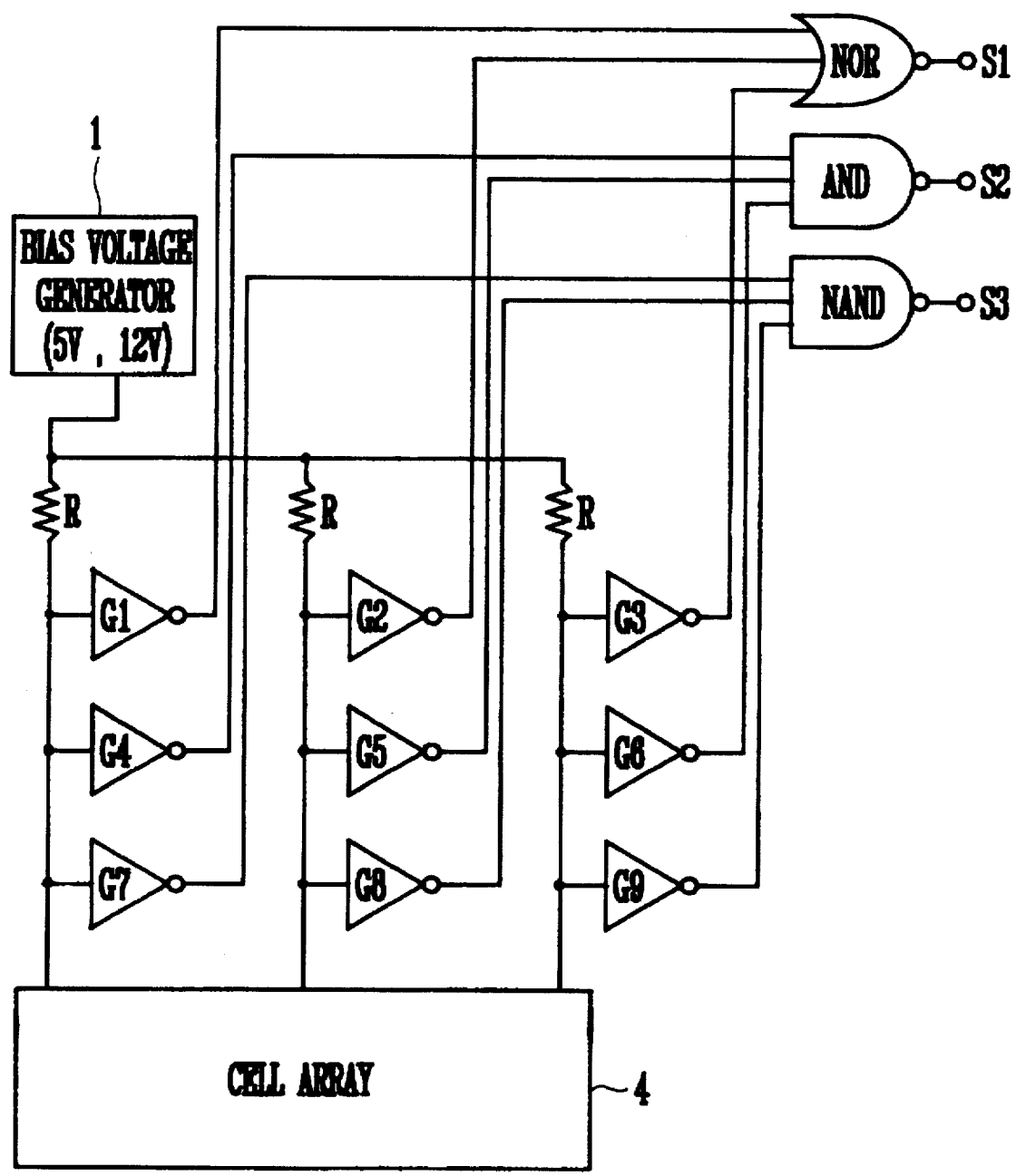
FIG. 6 is a circuit for explaining program and erasure verification method according to the present invention.

FIG. 2B illustrates a circuit of erasure mode and bias condition thereof. The circuit of erasure mode is equal to that of program mode except for bias condition. Accordingly, erasure state of the cell can be verified in the manner same as program mode of FIG. 2A. However, to verify the erasure state together with prevention of over erasure phenomenon of the cell during erasure mode, two(2) inverters, of which threshold voltage is different from each other, are required. An embodiment of the invention which can verify a desired threshold voltage during a byte program and a byte erasure using the above principle will be explained through FIG. 6.

In program operation, program voltage (5volt) from a bias voltage generator 1 is applied to a cell array 4. During program operation; if memory cells selected from each cell array 4 are enough programmed, threshold voltage of each cell is inverted by inverters G1, G2 and G3, respectively, and program state is then verified by an output signal S1 of a NOR gate(NOR) of which input terminals are connected to output terminals of the inverters G1, G2 and G3.

In erasure operation, erasure voltage(12 volt) from the bias voltage generator 1 is applied to the cell array 4. During erasure operation, if memory cells selected from each cell array 4 is enough reached at a predetermined threshold voltage level of erasure state, threshold voltage of each cell is inverted by inverters G4, G5 and G6, respectively and erasure state is then verified by an output signal S2 of an AND gate(AND) of which input terminals are connected to output terminals of the inverters G4, G5 and G6.

In the meantime, even if threshold voltage of any one memory cell is less than a predetermined threshold voltage for erasure mode, over erasure can be prevented by an output signal S3 of NAND gate NAND of which input terminals are connected to inverters G7, G8 and G9.

If the bias voltage generator is adequately controlled by the output signals S1, S2 and S3, it is possible to verify cell threshold voltage in rapidly.

As described above, according to the present invention, since cell threshold voltage can be automatically verified by change of electron charge injected to a floating gate during program and erasure mode, program and erasure time for the cell is reduced as well as over erasure which is often occurred in stacked type cell is prevented. Also, there is excellent advantage that can simplify whole circuit of a flash memory device since separated threshold voltage verification circuit is not required.

The foregoing description, although described in its preferred embodiment with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A threshold voltage verification circuit of a non-volatile memory cell having a control gate, a drain and source, comprising:
    a first means for supplying a bias voltage to said gate, said drain and said source during program mode or erasure mode;
    a second means for generating a logic signal that depends on drain current of said cell, having an input logic threshold voltage that is equal to a predetermined threshold voltage of said cell given by the following equation:

$$Vd(t)=Vcc-R \times Id(t),$$

wherein,
Vd(t): input logic threshold voltage,
Vcc: supply voltage,
R: register, and
Id(t): drain current of the cell.

2. A threshold voltage verification circuit of a non-volatile memory device comprising:
    a first means for generating logic signals according to each drain current of selected memory cells for program mode;
    means for generating a program verification signal according to combination of said logic signals from said first means;

a second means for generating logic signals according to each drain current of selected memory cells for erasure mode; and means for generating an erasure verification signal according to combination of said logic signal from said second means.

3. The circuit of claim 2, wherein said first means comprises a plurality of inverters.

4. The circuit of claim 2, wherein said second means comprises a plurality of inverters.

5. The circuit of claim 2, wherein said means for generating the program verification signal comprises a NOR gate.

6. The circuit of claim 2, wherein said means for generating the erasure verification signal comprises an AND gate.

7. The circuit of claim 3 or claim 6, wherein each input logic threshold voltage of said inverters is equal to each threshold voltage of said cells.

8. The circuit of claim 2, further comprising:

a third means for generating logic signals according to each drain current of selected memory cell for erasure mode; and means for an over erasure signal according to the combination of said logic signal from said third means.

9. The circuit of claim 8, wherein said third means comprises a plurality of inverters.

10. The circuit of claim 8, wherein said means for generating the over erasure signal comprises a NAND gate.

11. The circuit of claim 9, wherein each input logic threshold voltage of said inverters is equal to each threshold voltage of said cells.

* * * * *